United States Patent [19]

Moritani et al.

[11] Patent Number: 4,709,218
[45] Date of Patent: Nov. 24, 1987

[54] OVERTONE CRYSTAL OSCILLATOR

[75] Inventors: Nakanobu Moritani; Mitsuyuki Sugita; Isamu Hoshino; Hirofumi Yanagi; Hitoshi Ikeno; Tetsuro Konno, all of Tokyo, Japan

[73] Assignee: Seikosha Co., Ltd., Tokyo, Japan

[21] Appl. No.: 885,930

[22] Filed: Jul. 15, 1986

[30] Foreign Application Priority Data

Jul. 15, 1985 [JP] Japan ................ 60-155733

[51] Int. Cl.$^4$ ................................ H03B 5/36
[52] U.S. Cl. ...................... 331/116 FE; 331/158
[58] Field of Search ............. 331/116 R, 116 FE, 158

[56] References Cited

U.S. PATENT DOCUMENTS 4,376,918  3/1983  Masuda et al. ............. 331/158 X

OTHER PUBLICATIONS

Parzen, *Design of Crystal and Other Harmonic Oscillators*, pp. 153–160, 1983, John Wiley & Sons, New York.

*Primary Examiner*—Siegfried H. Grimm
*Attorney, Agent, or Firm*—Bruce L. Adams; Van C. Wilks

[57] ABSTRACT

An overtone crystal oscillator includes a crystal vibrator, a CMOS circuit connected in parallel to the crystal vibrator, and two load capacitors connected to the input and output of the CMOS circuit, respectively. The capacitors have respective capacitances $C_g$ and $C_d$ determined to satisfy at least one of following two conditions wherein the first condition is that an oscillation starting resistance $R_{KN}$ of a desired N-th overtone is sufficiently larger than an effective resistance $R_{QN}$ of the crystal vibrator of the N-th overtone, the oscillation starting resistance being expressed as:

$$R_{KN} = K/(\omega^2 \cdot C_g \cdot C_d)$$

($\omega$: oscillating frequency, K: constant determined by mutual conductance of the CMOS circuit) and the second condition is that an effective resistance $R_{Qn}$ of the crystal vibrator of another n-th overtone except the desired N-th overtone satisfies the following relation $$R_{Qn} > N^2 \cdot R_{KN}/n^2.$$

4 Claims, 17 Drawing Figures

OSCILLATION CIRCUIT

FIG. 1

|  | 3rd OVERTONE | 5th OVERTONE | 7th OVERTONE |
|---|---|---|---|
| 1st OVERTONE | $R_{e1} > \frac{3^2}{1^2} R_{KM3}$ | $R_{e1} > \frac{5^2}{1^2} R_{KM5}$ | $R_{e1} > \frac{7^2}{1^2} R_{KM7}$ |
| 3rd OVERTONE | SPECIFIED OVERTONE $R_{e3} \ll R_{KM3}$ | $R_{e3} > \frac{5^2}{3^2} R_{KM5}$ | $R_{e3} > \frac{7^2}{3^2} R_{KM7}$ |
| 5th OVERTONE | $R_{e5} > \frac{3^2}{5^2} R_{KM3}$ | SPECIFIED OVERTONE $R_{e5} \ll R_{KM5}$ | $R_{e5} > \frac{7^2}{5^2} R_{KM7}$ |
| 7th OVERTONE | $R_{e7} > \frac{3^2}{7^2} R_{KM3}$ | $R_{e7} > \frac{5^2}{7^2} R_{KM5}$ | SPECIFIED OVERTONE $R_{e7} \ll R_{KM7}$ |

FIG. 2

|  | 3rd OVERTONE | 5th OVERTONE | 7th OVERTONE |
|---|---|---|---|
| 1st OVERTONE | $R_{e1} > \frac{3^2}{1^2} R_{KM3}$ | $R_{e1} > \frac{5^2}{1^2} R_{KM5}$ | $R_{e1} > \frac{7^2}{1^2} R_{KM7}$ |
| 3rd OVERTONE | SPECIFIED OVERTONE $R_{e3} \ll R_{KM3}$ | $R_{e3} > \frac{5^2}{3^2} R_{KM5}$ | $R_{e3} > \frac{7^2}{3^2} R_{KM7}$ |
| 5th OVERTONE | $R_{e5} > \frac{3^2}{5^2} R_{KM3}$ OR $\sigma_3 > \sigma_5$ | SPECIFIED OVERTONE $R_{e5} \ll R_{KM5}$ | $R_{e5} > \frac{7^2}{5^2} R_{KM7}$ |
| 7th OVERTONE | $R_{e7} > \frac{3^2}{7^2} R_{KM3}$ OR $\sigma_3 > \sigma_7$ | $R_{e7} > \frac{5^2}{7^2} R_{KM5}$ OR $\sigma_5 > \sigma_7$ | SPECIFIED OVERTONE $R_{e7} \ll R_{KM7}$ |

FIG. 3

| | 3rd OVERTONE | 5th OVERTONE | 7th OVERTONE |
|---|---|---|---|
| 1st OVERTONE | OR $R_{e1} > \frac{3^2}{1^2} R_{KM3}$ $\sigma_3 > \sigma_1$ | OR $R_{e1} > \frac{5^2}{1^2} R_{KM5}$ $\sigma_5 > \sigma_1$ | OR $R_{e1} > \frac{7^2}{1^2} R_{KM7}$ $\sigma_7 > \sigma_1$ |
| 3rd OVERTONE | SPECIFIED OVERTONE $R_{e3} \ll R_{KM3}$ | OR $R_{e3} > \frac{5^2}{3^2} R_{KM5}$ $\sigma_5 > \sigma_3$ | OR $R_{e3} > \frac{7^2}{3^2} R_{KM7}$ $\sigma_7 > \sigma_3$ |
| 5th OVERTONE | OR $R_{e5} > \frac{3^2}{5^2} R_{KM3}$ $\sigma_3 > \sigma_5$ | SPECIFIED OVERTONE $R_{e5} \ll R_{KM5}$ | OR $R_{e5} > \frac{7^2}{5^2} R_{KM7}$ $\sigma_7 > \sigma_5$ |
| 7th OVERTONE | OR $R_{e7} > \frac{3^2}{7^2} R_{KM3}$ $\sigma_3 > \sigma_7$ | OR $R_{e7} > \frac{5^2}{7^2} R_{KM5}$ $\sigma_5 > \sigma_7$ | SPECIFIED OVERTONE $R_{e7} \ll R_{KM7}$ |

FIG. 4

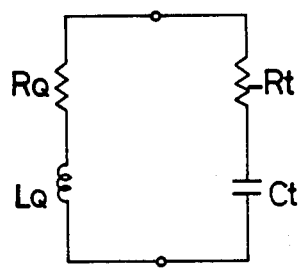

FIG. 5

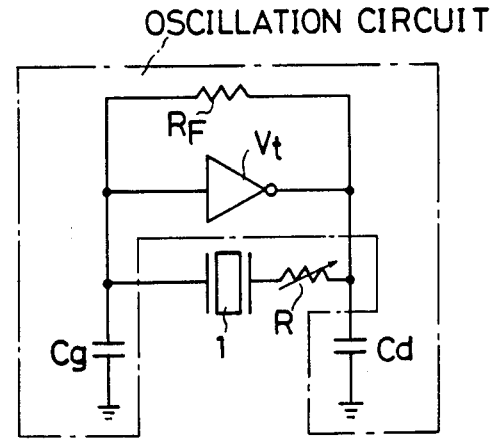

FIG.13

| OVER-TONE | fs (KHz) | fL(28.2 PF) (KHz) | Rq (Ω) | Cm (fF) | Lm (H) | Q (×10³) | Co (PF) |
|---|---|---|---|---|---|---|---|
| 1 | 5376.689 | 5377.059 | 4521 | 4.06 | 0.216 | 1.6 | |
| 3 | 15999.930 | 16000.076 | 35.7 | 0.538 | 0.184 | 517.3 | 1.30 |
| 5 | 26645.033 | 26645.111 | 78.5 | 0.173 | 0.207 | 440.7 | |

FIG.14

| 1st OVERTONE | $R_{Q1} > \frac{3^2}{1^2} R_{KM3}$ $5.65^{K\Omega} \quad 2.385^{K\Omega}$ | $\sigma_3 > \sigma_1$ 0.62 −16.37 |
|---|---|---|
| 3rd OVERTONE (SPECIFIED OVERTONE) | $R_{Q3} \ll R_{KM3}$ 0.044    0.265 | $\sigma_3 = 0.62$ |
| 5th OVERTONE | $R_{Q5} > \frac{3^2}{5^2} R_{KM3}$ 0.098    0.095 | $\sigma_3 > \sigma_5$ 0.62   0.05 |

FIG. 15
| | | | | |
|---|---|---|---|---|
| 1st OVERTONE | $R_{Q1} >$ | $\frac{3^2}{1^2} R_{KM3}$ | $\sigma 3 >$ | $\sigma 1$ |
| | KΩ 5.65 | KΩ 3.78 | 1.04 | −1.71 |
| 3rd OVERTONE (SPECIFIED OVERTONE) | $R_{Q3} \ll$ 0.0446 | $R_{KM3}$ 0.42 | $\sigma 3 = 1.04$ | |
| 5th OVERTONE | $R_{Q5} <$ 0.098 | $R_{KM3}$ 0.152 | $\sigma 3 >$ 1.04 | $\sigma 5$ 0.18 |
FIG. 16
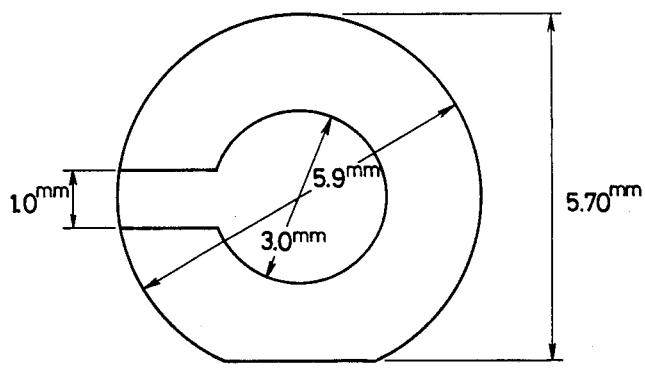
FIG. 17

ONE

OVERTONE CRYSTAL OSCILLATOR

BACKGROUND OF THE INVENTION

The present invention relates to an overtone crystal oscillator.

DESCRIPTION OF THE PRIOR ART

It is necessary to provide a circuit with some frequency selectivity in order to overtone-oscillate a crystal oscillator. For this purpose, according to a conventional method, there is added a tuning circuit consisting of an inductor L and a capacitor C and designed for tuning the oscillator to higher harmonic waves. Save for this type, there is proposed another type wherein an effective capacity in the tuning frequency is added in place of the tuning circuit.

OBJECT OF THE INVENTION

Inasmuch as the circuits of both types are invested with the frequency selectivity, such crystal oscillators have crucial defects that they are apt to oscillate at higher overtones which are beyond the predetermined range, in case that some fluctuations in circuit constants are produced depending upon design conditions, manufacturing conditions, utilizing conditions or the like.

So far as the former type is concerned, it has disadvantages in terms of space and cost on account of the necessity to employ coils.

In the later type, a frequency adjusting range is narrow. A problem arises in terms of stability, if the adjusting range is expanded. This kind of problem is particularly incident to a discrete type crystal oscillator.

According to the present invention, it is feasible to effect stable oscillation at a specified high overtone without adding a new circuit endued with frequency selectivity.

BRIEF DESCRIPTION OF THE DRAWINGS

FIG. 1 is a table showing one example of oscillating conditions according to the present invention.

FIGS. 2 and 3 are tables showing other oscillating conditions, respectively.

FIG. 4 is an equivalent circuit diagram illustrating a crystal oscillating circuit in a two-terminal form.

FIG. 5 is a circuit diagram showing a constitution when actually measuring an oscillation starting resistance.

FIG. 13 is a table showing constants of the oscillating circuit used in the present experiment.

FIG. 14 is a graph showing experimental result.

FIG. 15 is a table showing experimental results obtained when employing a CMOS circuit which is different from that of FIG. 14.

FIG. 16 is a plan view showing a crystal vibrator designed for measuring multiple characteristics of a fundamental wave vibrator. and FIG. 17 is an elevational view of FIG. 16.

DETAILED DESCRIPTION OF THE INVENTION

At the first onset, oscillation starting conditions in a CMOS crystal oscillator will hereinafter be explained. A crystal oscillation circuit which is at an oscillation starting time is described as a two-terminal form. Namely, this can be defined as an equivalent circuit as shown in FIG. 4. In FIG. 4, $R_Q L_Q$ are provided on the side of the crystal vibrator, while on the other hand $-R_t$ and $C_t$ are disposed on the side of the CMOS circuit. The negative resistance $R_t$ that is placed on the side of the CMOS circuit is given by the following formula:

$$R_t = g_m/(\omega^2 \cdot C_g \cdot C_d) \quad (1)$$

($g_m$: mutual conductance of the CMOS circuit, $\omega$: oscillating frequency, $C_g$ and $C_d$: load capacitors as shown in FIG. 5)

If the following inequality be fulfilled, $$R_Q < |-R_t|$$

the oscillation will start.

Where the crystal oscillation circuit is overtone-oscillated at the specified overtone, it is quite important to discover factors by which the negative resistance $R_t$ changes according to the respective overtones. It is favorable that the negative resistance $R_t$ could theoretically be determined by the aforementioned formula (1). However, this formula contains the mutual conductance $g_m$, so that it is difficult to deal with this formula as a theoretical formula for determining the oscillation starting condition. Because, $g_m$ is measured in such a state that the conditions ($\omega$, $C_g$, $C_d$) of the crystal oscillator are first determined.

An equivalent negative resistance $R_k$ (hereinafter referred to as oscillation starting resistance) at the oscillation starting time is given by the formula (2).

$$R_k = K/(\omega^2 \cdot C_g \cdot C_d) \quad (2)$$

where K is a constant.

Namely, supposing that $g_m$ of the formula (1) is constant, the formula (1) is modified into the formula (2).

If the formula (2) is established, it becomes possible to compute $R_k$ based on the respective parameters, whereby the equivalent negative resistance $R_k$ can theoretically be obtained.

In the second place, it is essential to confirm whether the formula (2) is in fact established or not by making a comparison between the computed results and the actually measured results.

Figure 6:
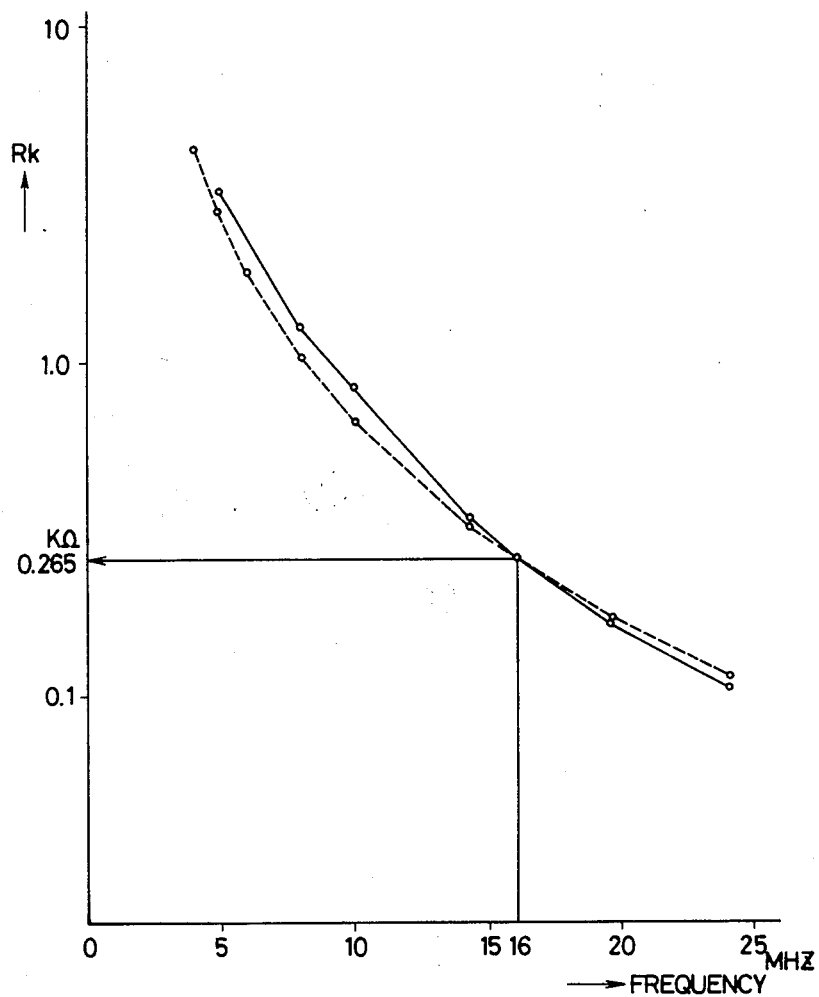
FIG. 6 is a graph showing characteristics obtained by actually measuring and computing the oscillation starting resistance in case of an oscillating frequency being defined as a parameter.
Figure 7:
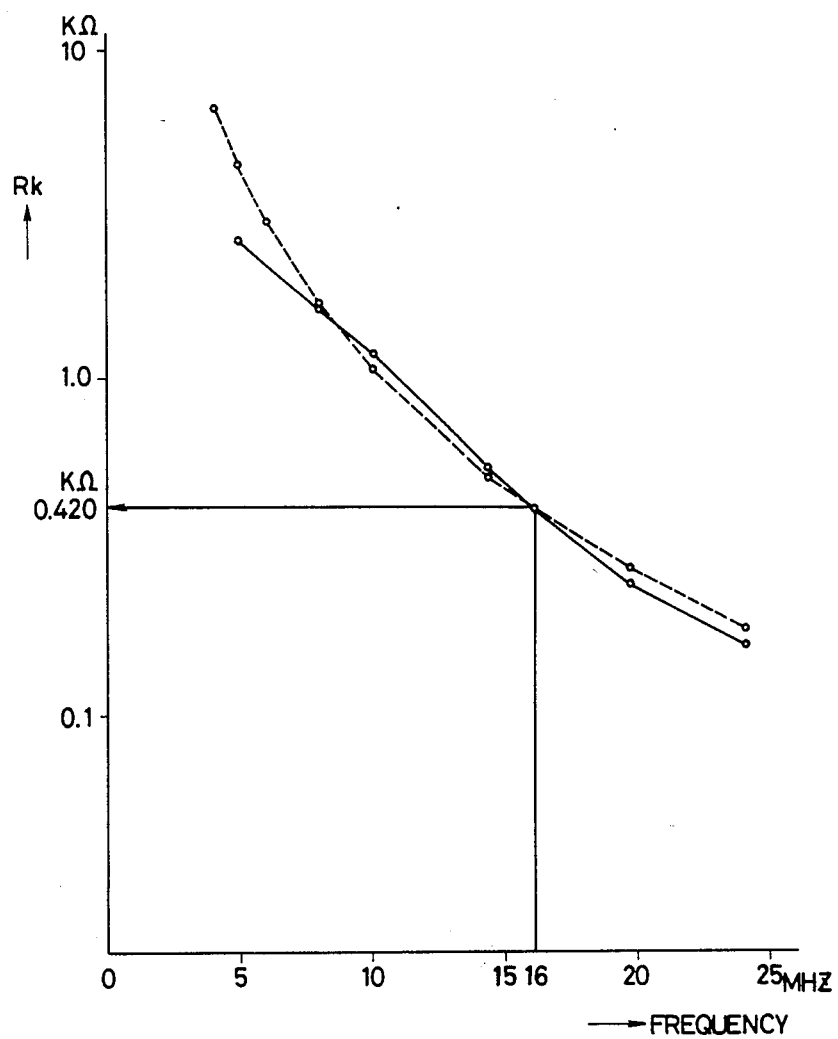
FIG. 7 is a graph showing characteristics when employing a CMOS circuit which is different from that of FIG. 6.

A method of actually measuring the actual oscillation starting resistance $R_k$ will be described. As depicted in FIG. 5, the overtone crystal oscillation circuit for the measurement comprises a CMOS circuit $V_t$ having input and output terminals, a feedback resistor $R_f$ connected between the input and output terminals of the CMOS circuit $V_t$, a crystal vibrator 1 connected between the input and output terminals of the CMOS circuit $V_t$ and load capacitors $C_g$ and $C_d$ respectively connected to the input and output terminals of the CMOS circuit $V_t$. Further, a variable resistance R is connected in series to the crystal vibrator 1. Where the variable resistance R is changed to vary from a high resistance to change an oscillating frequency to a low resistance, the sum of the resistance value and the equivalent series-resistance value of the crystal vibrator which are obtained when starting the oscillation is measured as the actual oscillation starting resistance $R_k$. FIGS. 6, 7 show measurement results and computed results given by the formula (2). In the Figures, a solid line indicates the actually measured values; and a broken line indicates the computed values.

This experiment adopts two different circuits wherein the actual measurement is effected by connecting $C_g$ and $C_d$ of 22 $_pF$ to crystal vibrators, the oscillation frequencies of which are different from each other and by connecting $C_g$ and $C_d$ to two CMOS circuits each having different drivability. Referring to FIGS. 6, 7, there are shown actually measured values and computed values acquired when the different kinds of CMOS circuits are employed. The computed values are obtained by steps in which $R_k$ is actually measured just when $C_g$ and $C_d$ of 22 $_pF$ are connected to a crystal vibrator of 16 MHz as reference data, from the actually measured value the constant K is determined and $R_k$ at various oscillation frequencies is computed by using the thus determined constant K according to the formula (2).

As an exemplification, $R_k$ in the crystal vibrator of 16 MHz shown in FIG. 6 is 0.265 K$\Omega$, and $R_k$ in the crystal vibrator shown in FIG. 7 presents 0.420 K$\Omega$.

As can be clarified from these Figures, the computed values accord very well with the actually measured values. Moreover, it is confirmed that the formula (2) is established as the theoretical one by which the equivalent negative resistance or oscillation starting resistance $R_k$ is computed under such conditions that $C_g$ and $C_d$ are fixed and the oscillating frequency is swept as a parameter.

Figure 8:
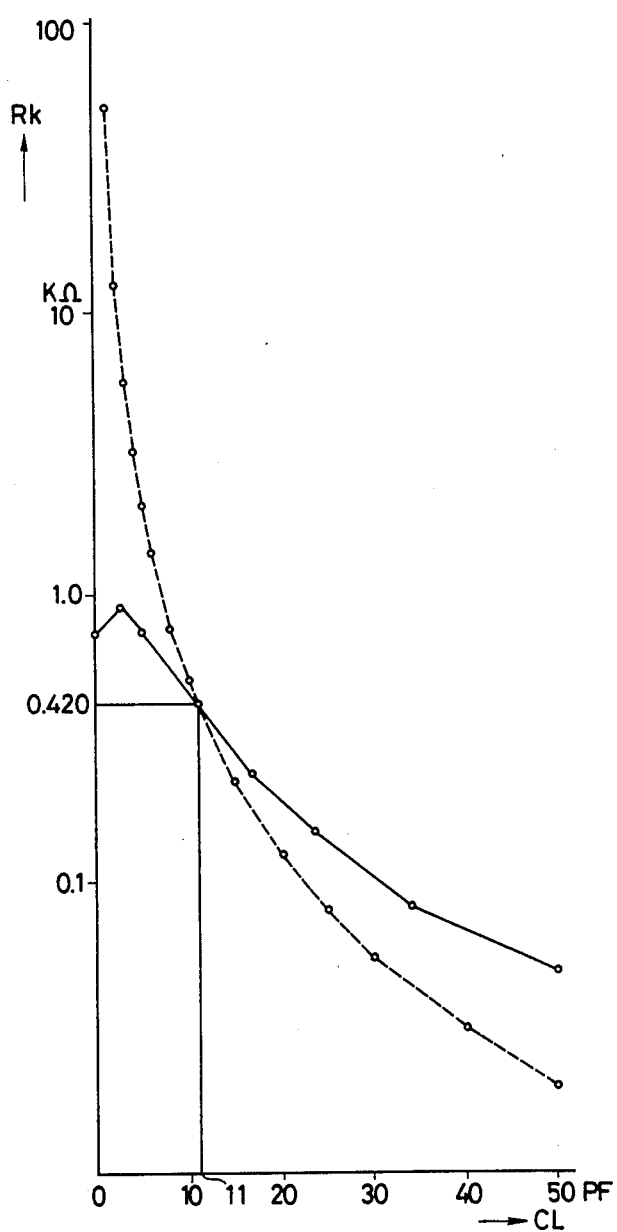
FIG. 8 is a graph showing characteristics of a fundamental wave vibrator which are obtained by actually measuring and computing the oscillation starting resistance on the occasion of a load capacity being defined as a parameter.

When the oscillating frequency is fixed, there is made an experiment as to whether the formula (2) is verified or not by using $C_g$ and $C_d$ as parameters. This experiment adopts the crystal vibrator whose fundamental frequency is 16 MHz. $R_k$ is actually measured by varying a load capacity $C_L = \frac{1}{2}(C_g + C_d)$ from 0 to 50 $_pF$. In this experiment, the same CMOS circuit as that used in the experiment of FIG. 7 is employed. FIG. 8 shows the actually measured values and the computed values obtained in this experiment. In the Figure, the solid line indicates the actually measured values and the broken line exhibits the computed values based on the formula (2).

As for the computed values, the constant K is at first computed by utilizing the actually measured values of $R_k$ in $C_L = 11$ $_pF(C_g + C_d = 22$ $_pF)$ as reference data, and the thus computed constant K is introduced into the formula (2) thereby to compute $R_k$ for various capacities of the load capacitors.

As can be understood from FIG. 8, it proves that the computed values do not coincide well with the actually measured values. This is attributed to influences caused by internal capacities or the like of the CMOS circuits which constitute the oscillation circuit. Namely, the formula (2) includes external load capacities only, and the internal capacities of the CMOS circuits are not taken into consideration, this probably causing the error shown in FIG. 8.

Hence, if there are not various kinds of parasitic capacities such as the internal capacities or the like of the CMOS circuit, it is assumed that the actually measured values of FIG. 8 substantially accord with the computed values.

Figure 9:
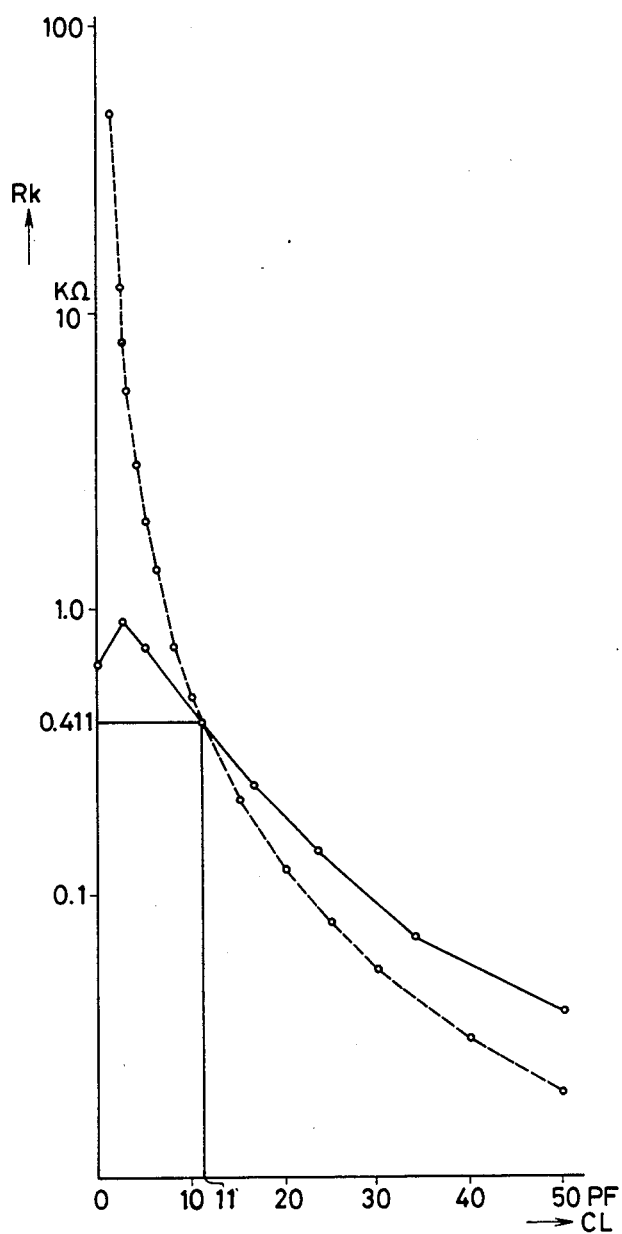
FIG. 9 is a graph similar to that of FIG. 8, showing characteristics thereof when employing a 3rd overtone vibrator.

FIG. 9 shows results of an experiment and computation obtained by the use of a crystal vibrator with a 3rd overtone of 16 MHz and the CMOS circuits used in the experiment of FIG. 7. These results turn out to have a similar tendency to those of FIG. 8.

It becomes apparent from observing FIGS. 8, 9 that there exists a value of $R_k$ less than 1.5 K$\Omega$ even when the load capacity is at 0 $_pF$. This means that it is feasible to constitute the CMOS circuits under such conditions that there is no load capacity. It is therefore difficult to externally secure load capacities such as a plastic package or the like and an arrangement of an oscillating circuit into which the CMOS circuits and the crystal vibrator are integrally combined can be considered.

The conditions under which the crystal oscillator is overtone-oscillated will hereinafter be described. It is required to take the following conditions into account in order to oscillate stably at a specified overtone.

As a condition under which the oscillation is effected at the specified overtone, an effective resistance $R_{QN}$ of the crystal vibrator of the specified N-th overtone and an oscillation starting resistance $R_{KN}$ of the same overtone must satisfy this inequality: $R_{QN} << R_{KN}$.

Secondly, as a condition under which the oscillation is by no means carried out at other overtones than the specified one, one of the following two conditions may be fulfilled.

As one condition under which the oscillation never occurs at overtones other than the specified one, an effective resistance $R_{qn}$ of the n-th overtone save for the specified overtone and the corresponding oscillation starting resistance $R_{Kn}$ meet this inequality: $R_{qn} > R_{Kn}$. However, $$R_{Kn} = k / \left( \frac{n^2}{N^2} \omega^2 \cdot Cg \cdot Cd \right) =$$

$$N^2 \cdot k/(n^2 \cdot \omega^2 \cdot Cg \cdot Cd) = N^2 \cdot R_{KN}/n^2,$$

and $R_{Kn}$ is expressed as a function of $R_{KN}$.

Another condition is such that it may be possible to oscillate the vibrator at the n-th overtone save for the specified overtone however, the possibility of the oscillation is largely inclined to the specified overtone.

As a factor to express the last condition, a growth coefficient is defined which exhibits favorableness of an oscillation starting property.

Figure 10:
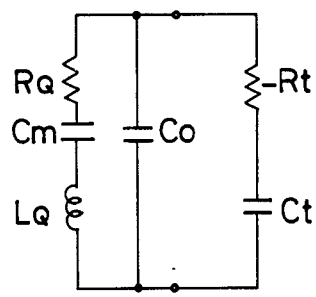
FIG. 10 is a diagram showing an equivalent circuit of the crystal oscillating circuit.

The growth coefficient is now described as follows: In the crystal oscillation circuit employing the CMOS circuit, the CMOS circuit functions in an active region when the oscillation starts, so that it can be considered as a minute signal amplifier. In the light of an equivalent circuit of the crystal oscillator as shown in FIG. 10, provided that the voltage and the electric current vary according to $e^{st}$ at the starting time of oscillation, an impedance Z of a closed circuit can be given as:

$$Z \approx R_Q - R_t + SL + (1/C_m + 1/C_t) \cdot 1/S \qquad (3)$$

Z becomes 0, and hence substitution is made as follows:

$$R_Q - R_t + SL + (1/C_m + 1/C_t)\cdot 1/S = 0 \text{ Consequently,}$$
S can be given as below.

$$S = (R_Q - R_t)/2L + \sqrt{\{(R_Q - R_t)/2L\}^2 - 1/L(1/C_m - 1/C_t)} \quad (4)$$

and furthermore, the growth coefficient $\sigma$ is defined as:

$$\sigma = (R_Q - R_t)/2L \quad (5)$$

then, $$\omega = \sqrt{1/L(1/C_m + 1/C_t)} \quad (6)$$

and, $$\begin{aligned} S &= \sigma + \sqrt{j\omega^2 - \sigma^2} \\ &= \sigma + jw' \\ &(\omega >> \sigma) \end{aligned} \quad (7)$$

therefore, when the oscillation starts, the voltage and the electric current waveform are expressed as follows:

$$e^{st} = e^{\sigma t} e^{j\omega'} \quad (8)$$

$$\sigma \geq 0$$

Namely, the amplitude increases by $e^{\sigma t}$ and finally enters a non-linear region of the circuit and hence $g_n$ decreases (the negative resistance $R_t$ is reduced), and the oscillation circuit gets into a stationary state when $\sigma = 0$, $S = j\omega$.

It can be understood from the formula (5) that $\sigma$ decreases according as the inductance L increases, and it is likewise obvious from the formula (8) that the larger $\sigma$ is, the sooner the oscillation circuit gets into the stationary state.

Figure 11:
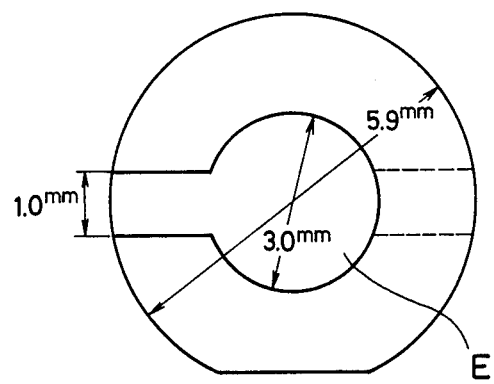
FIG. 11 is a plan view showing the crystal vibrator utilized in the present invention.
Figure 12:
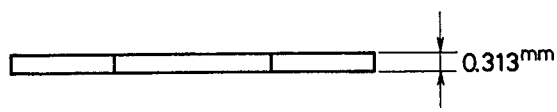
FIG. 12 is an elevational view of FIG. 11.

Therefore, if the growth coefficient $\sigma_N$ of the specified overtone is larger than the growth coefficient $\sigma_n$ of the n-th overtone other than the specified one, it proves that the oscillation is effected at the specified overtone. 3rd overtone crystal oscillator which meets the above-described conditions is constructed with the intention of confirming whether the oscillation practically starts at the 3rd overtone or not. To accomplish this experiment, the previously used two CMOS circuits, the oscillation starting resistances $R_k$ of which are different from each other are utilized. The experiment is effected on the two CMOS circuits by connecting the crystal vibrator thereto which is depicted in FIGS. 11, 12. A thickness of a Ag-vapor deposited film E of the crystal vibrator is 15000 Å and the opposite surface thereof is formed with the same kind of electrode. FIG. 13 shows equivalent circuit constants of the crystal vibrator. In the Figure, $f_s$ is the series resonant frequency, and $f_L$ is the oscillating frequency when a capacitor of 28.2 $_p$F is connected in series to the crystal vibrator.

FIG. 14 shows experimental results for an oscillator using the CMOS circuit (the same circuit as that used in FIG. 6) whose oscillator starting resistance is 0.265 KΩ at the 3rd overtone. As can be seen from the Figure in regard to the 3rd overtone, the effective resistance $R_{Q3}$ (0.044 KΩ) of the crystal vibrator is considerably smaller than an oscillation starting resistance $R_{KM3}$ (0.265 KΩ) and the growth coefficient $\sigma_3$ amounts to 0.62. Moreover, as regards the overtones save for the specified one, the effective resistance is larger than the oscillation starting resistance; and the growth coefficients of the respective overtones are smaller than that of the 3rd overtone. It can be ascertained that the oscillation never occurs at other overtones than the specified one, whereas stable oscillation can be obtained only at the 3rd overtone.

FIG. 15 shows experimental results on the occasion of using the CMOS circuit (the same circuit employed in FIG. 7) in which the 3rd overtone oscillation starting resistance is 0.42 KΩ. In this case, the results are the same with the above-described 1st and 3rd overtone. On the other hand, the effective resistance (0.098 KΩ) is smaller than the oscillation starting resistance (0.152 KΩ) of the 5th overtone, this implying the possibility of oscillation with respect to the 5th overtone. When it comes to the growth coefficient, however, a growth coefficient $\sigma_5$ (0.18) of the 5th overtone is less than a growth coefficient $\sigma_3$ (1.04) of the 3rd overtone and hence the oscillation is stably effected without the oscillation of the 5th overtone. It can be comprehended from the experiments thus far made that the following conditions are fulfilled for the purpose of performing the stable overtone oscillation.

As shown in FIG. 1, the most favorable arrangement is to satisfy such conditions that the oscillation starting resistance $R_{KMN}$ is adequately larger than the effective resistance $R_{QN}$ of the specified N-th overtone, while on the other hand the starting resistance $R_{KMn}$ of the n-th overtone save for the specified one is smaller than the corresponding effective resistance $R_{Qn}$. If fulfilled, the oscillation is by no means carried out at any other overtone than the specified one, so that the oscillation is securely effected at the specified overtone.

As shown in FIG. 2, the second condition to be fulfilled is such that in the onvertones lower than the specified one, the effective resistance is larger than the oscillation starting resistance, and in the overtones higher than the specified one, the effective resistance is less than the oscillation starting resistance, or the growth coefficient is smaller than that of the specified overtone. Namely, since the lower overtone than the specified one facilitate the oscillation, as compared with the higher overtones, the oscillation is strictly prohibited with regard to the lower overtones, while at the same time this condition is slightly slackened in case of the higher overtones.

It is the most moderate case to meet either a condition wherein the oscillation starting resistance exceeds the effective resistance of the overtones which are, as shown in FIG. 3, lower than the specified one, or a condition wherein the growth coefficient is smaller than that of the specified overtone. Under such moderate conditions, there is a possibility to oscillate even at other overtones than the specified overtone. However, the most desirable oscillation starting property is created at the specified overtone and the overtone oscillation of the specified overtone is therefore acquired.

The crystal vibrator whose fundamental frequency is 16 MHz and the crystal vibrator, the 3rd overtone wave of which is 16 MHz are connected to a common CMOS circuit to actually measure multiple characteristics of both vibrators for the sake of comparison. The vibrator having the above-mentioned fundamental frequency is identical with those used in FIGS. 16, 17, and the vibrator of the 3rd overtone wave is the same as those employed in FIGS. 11, 12. Almost no difference can be seen in the characteristics of frequency and temperature of both of the vibrators.

The vibrator of the 3rd overtone wave bears, it can be confirmed, more faborable stability than that of the fundamental frequency with respect to fluctuations in frequency toward the fluctuations in source voltage.

A relation contingent upon connecting positions of by-pass condensers of the power source will be described. To be specific, the oscillating circuit is connected through the intermediary of a long lead wire to the power source, and the by-pass condensers are connected to the vicinity of the oscillating circuit provided on the lead wire as well as in the proximity of the power source. The characteristics of source voltage and frequency are measured at the respective positions. As a result, it proves that there are seen conspicuous variations in characteristics of source voltage, depending on the connecting positions of the by-pass condensers with respect to the crystal vibrator having the fundamental frequency, whereas the crystal vibrator of the 3rd overtone receives almost no influence.

Namely, it can be affirmed that even if the by-pass condensers are connected in close proximity to the oscillating circuit or are so connected as to be separate therefrom, the crystal vibrator of the 3rd overtone does not undergo any influence, thereby maintaining stable oscillation.

Furthermore, it can be recognized that the crystal vibrator of the 3rd overtone takes a long oscillation starting time when the load capacity increases. However, if the load capacity is rendered relatively small, the oscillation starting time can considerably be reduced and hence there is for sure no problem.

To summarize the above-described points, the higher overtone oscillation is, it can be said, superior to the fundamental wave oscillation in terms of their characteristics.

It is to be noted that the present invention can similarly be applied to an ordinary Colpitts type oscillating circuit.

The present invention yields favorable effects wherein it is feasible to obtain stable higher overtone oscillation which is extremely superlative of its characteristics without adding a special tuning circuit thereto.

What is claimed is:

1. An overtone crystal oscillator comprising: a crystal vibrator; a CMOS circuit having input and output terminals and being connected parallel to said crystal vibrator at the input and output terminals thereof; and two capacitors connected to the input and output terminals of the CMOS circuit, respectively, the two capacitors having capacitances $C_g$ and $C_d$ determined to satisfy at least one of following two conditions wherein the first condition is that an oscillation starting resistance $R_{KN}$ of a desired N-th overtone of the overtone crystal oscillator is sufficiently larger than an effective resistance $R_{QN}$ of the crystal vibrator oscillating at the N-th overtone, the oscillation starting resistance being expressed by the relation:

$$R_{KN} = K/(\omega^2 \cdot C_g \cdot C_d)$$

where $\omega$ is the oscillating frequency of the oscillator, K is the constant determined by mutual conductance of the CMOS circuit, and the second condition is that an effective resistance $R_{Qn}$ of said crystal vibrator of an n-th overtone except the desired N-th overtone satisfies the following relation:

$$R_{Qn} > N^2 \cdot R_{KN}/n^2.$$

2. An overtone crystal oscillator comprising: a crystal vibrator having an equivalent resistance $R_{QN}$ related to a desired N-th overtone and being driven to oscillate at a frequency $\omega$ corresponding to the desired N-th overtone; a CMOS circuit having input and output terminals and a mutual conductance and being connected at the input and output terminals thereof in parallel to the crystal vibrator for driving the same; and a pair of load capacitors connected to the input and output terminals of the CMOS circuit, the capacitors having respective capacitances $C_g$ and $C_d$ determined to satisfy the following relation so as to effect the oscillation of the N-th overtone:

$$R_{QN} < K/(\omega^2 \cdot C_g \cdot C_d)$$

where K is a constant determined by the mutual conductance of the CMOS circuit.

3. An overtone crystal oscillator according to claim 2; wherein the crystal vibrator has another equivalent resistance $R_{Qn}$ related to an n-th overtone other than the desired N-th overtone, and the capacitors have the capacitances $C_g$ and $C_d$ determined to satisfy the following relation so as to suppress the oscillation of the n-th overtone:

$$R_{Qn} > N^2 \cdot K/(n^2 \cdot \omega^2 \cdot C_g \cdot C_d).$$

4. An overtone crystal oscillator according to claim 3; wherein the capacitors have the capacitances $C_g$ and $C_d$ determined to satisfy the following relation:

$$R_{Qn} > N^2 \cdot K/(n^2 \cdot \omega^2 \cdot C_g \cdot C_d)$$

where $n < N$.

* * * * *